(12) United States Patent
Zhao et al.

(10) Patent No.: US 10,848,152 B2
(45) Date of Patent: Nov. 24, 2020

(54) OPTICALLY ISOLATED MICROMACHINED (MEMS) SWITCHES AND RELATED METHODS COMPRISING A LIGHT TRANSMITTING ADHESIVE LAYER BETWEEN AN OPTICAL RECEIVER AND A LIGHT SOURCE

(71) Applicant: Analog Devices Global Unlimited Company, Hamilton (BM)

(72) Inventors: Ying Zhao, Andover, MA (US); Alan O'Donnell, Castletroy (IE); Michael James Twohig, Cork (IE); Olly J. Kierse, Killaloe (IE); James Thomas Sheeran, Abbeyleix (IE); Michael C. W. Coln, Lexington, MA (US); Paul W. Stevens, Andover, MA (US); Bruce A. Hecht, Brookline, MA (US); Padraig Fitzgerald, Mallow (IE); Mark Schirmer, Sunapee, NH (US)

(73) Assignee: Analog Devices Global Unlimited Company, Hamilton (BM)

( * ) Notice: Subject to any disclaimer, the term of this patent is extended or adjusted under 35 U.S.C. 154(b) by 19 days.

(21) Appl. No.: 16/137,640

(22) Filed: Sep. 21, 2018

(65) Prior Publication Data

US 2019/0288686 A1 Sep. 19, 2019

Related U.S. Application Data

(60) Provisional application No. 62/643,567, filed on Mar. 15, 2018.

(51) Int. Cl.
*H01L 25/16* (2006.01)
*H03K 17/94* (2006.01)
*H01H 59/00* (2006.01)

(52) U.S. Cl.
CPC ....... *H03K 17/943* (2013.01); *H01H 59/0009* (2013.01); *H01L 25/167* (2013.01)

(58) Field of Classification Search
CPC .............. H04N 1/00997; G02B 6/4246; G02B 6/4292; H01H 59/0009; H01L 25/167;
(Continued)

(56) References Cited

U.S. PATENT DOCUMENTS 5,626,619 A * 5/1997 Jacobson ............. A61N 1/3931
607/5
5,966,230 A 10/1999 Swartz et al.
(Continued)

FOREIGN PATENT DOCUMENTS

JP 59-114877 A2 7/1984
JP H011-46138 A 6/1989
(Continued)

OTHER PUBLICATIONS

[No Author Listed], Optical MEMS. AG Microsystems Inc. retrieved from the Internet on Dec. 5, 2018. 2 pages. http://agmicrosystems.com/technology/optical-mems/.
(Continued)

*Primary Examiner* — Que Tan Le
(74) *Attorney, Agent, or Firm* — Wolf, Greenfield & Sacks, P.C.

(57) ABSTRACT

Optically isolated micromachined (MEMS) switches and related methods are described. The optically isolated MEMS switches described herein may be used to provide isolation between electronic devices. For example, the optically isolated MEMS switches of the types described herein can enable the use of separate grounds between the receiving electronic device and the control circuitry. Isolation of high-voltage signals and high-voltage power supplies can be achieved by using an optical isolator and a MEMS switch,
(Continued)

where the optical isolator controls the state of the MEMS switch. In some embodiments, utilizing optical isolators to provide high voltages, the need for electric high-voltage sources such as high-voltage power supplies and charge pumps may be removed, thus removing the cause of potential damage to the receiving electronic device. In one example, the optical isolator and the MEMS switch may be co-packaged on the same substrate.

20 Claims, 13 Drawing Sheets

(58) Field of Classification Search
CPC .... H03K 17/943; H04B 10/40; H04B 10/615; H04B 10/1143; A61N 1/3912
USPC ..................................... 250/214 R, 306–309
See application file for complete search history.

(56) References Cited

U.S. PATENT DOCUMENTS

| | | | |
|---|---|---|---|
| 6,531,767 | B2 | 3/2003 | Shrauger |
| 6,943,378 | B2 | 9/2005 | Kek et al. |
| 7,030,416 | B2 | 4/2006 | Kitagawa et al. |
| 7,277,606 | B1 | 10/2007 | Sakai et al. |
| 7,388,186 | B2 | 6/2008 | Berg et al. |
| 7,872,735 | B2 | 1/2011 | Duggan et al. |
| 8,853,658 | B2 | 10/2014 | Maasi et al. |
| 8,970,124 | B2 * | 3/2015 | Kameyama ............ H05B 45/10 315/291 |
| 9,417,261 | B2 | 8/2016 | Salit et al. |
| 9,612,432 | B2 | 4/2017 | Graves et al. |
| 9,676,613 | B2 | 6/2017 | Iannotti et al. |
| 10,054,737 | B2 | 8/2018 | Kobrinsky et al. |
| 10,203,459 | B2 | 2/2019 | Lee |
| 10,254,476 | B1 | 4/2019 | Dutta |
| 10,684,420 | B2 | 6/2020 | Spector et al. |
| 2004/0061106 | A1 | 4/2004 | Kitagawa et al. |
| 2010/0237227 | A1 | 9/2010 | Koste et al. |
| 2012/0176135 | A1 | 7/2012 | Iannotti et al. |
| 2014/0035630 | A1 | 2/2014 | O'Donnell et al. |
| 2018/0180782 | A1 | 6/2018 | Bolognia |
| 2019/0212190 | A1 | 7/2019 | Bolognia et al. |
| 2020/0041728 | A1 | 2/2020 | Spector et al. |

FOREIGN PATENT DOCUMENTS

| | | |
|---|---|---|
| JP | 2004-103559 A | 4/2004 |
| JP | 2005-175706 A | 6/2005 |
| JP | 2008-135421 A | 6/2008 |
| JP | 2015-164248 A | 9/2015 |
| JP | 2016-503582 A | 2/2016 |
| JP | 2016-520257 A | 7/2016 |
| WO | WO 2014/078485 A1 | 5/2014 |
| WO | WO 2014/186656 A1 | 11/2014 |
| WO | WO 2017/082985 A2 | 5/2017 |

OTHER PUBLICATIONS

[No Author Listed], Stacked LED Technology for Integrated Optocouplers. Avago Technologies (Contributed Content) Jul. 13, 2013; 2 pages. Retrieved from the internet htttps://www.eeweb.com/profile/avago-technologies/articles/stacked-led-technology-for-integrated-optocouplers.

Hortschitz et al., Robust Precision Position Detection With an Optical MEMS Hybrid Device. IEEE Transactions on Industrial Electronics. Oct. 2011; 59(12):4855-4862.

Moridi et al., A Highly Sensitive a-Si Photodetector Array with Integrated Filter for Optical Detection in MEMS. Procedia Chemistry. 2009; 1:1367-70.

Pruessner et al., End-Coupled Optical Waveguide MEMS Devices in the Indium Phosphide Material System. Journal of Micromechanics and Microengineering. Mar. 2006; 16:832-842.

Szweda, Agilent optocouplers. III-Vs Review. The Advanced Semiconductor Magazine. May 2005; 18(4):34-6.

Tsai et al., MEMS Optical Switches and Interconnects. Elsevier. Apr. 2015; 37:33-40.

* cited by examiner

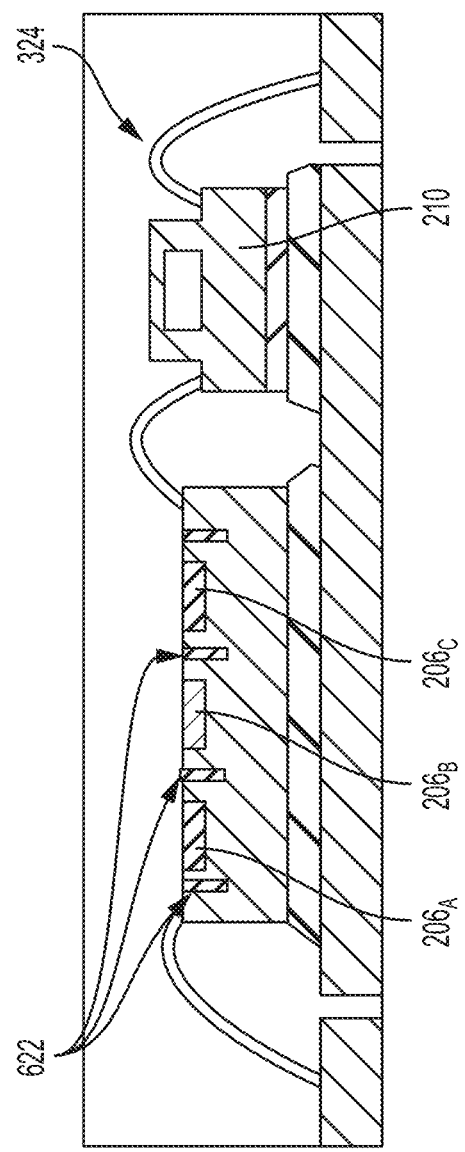

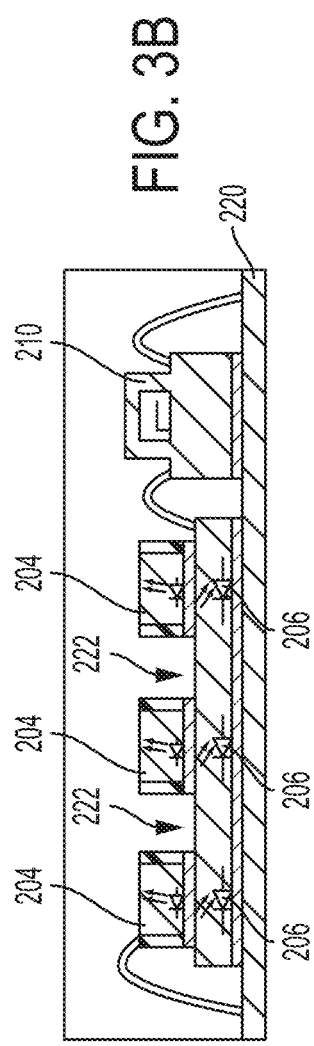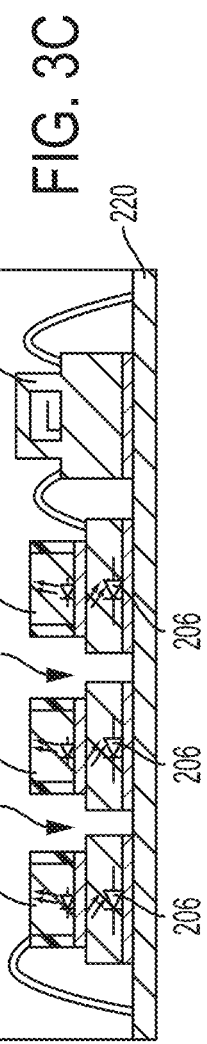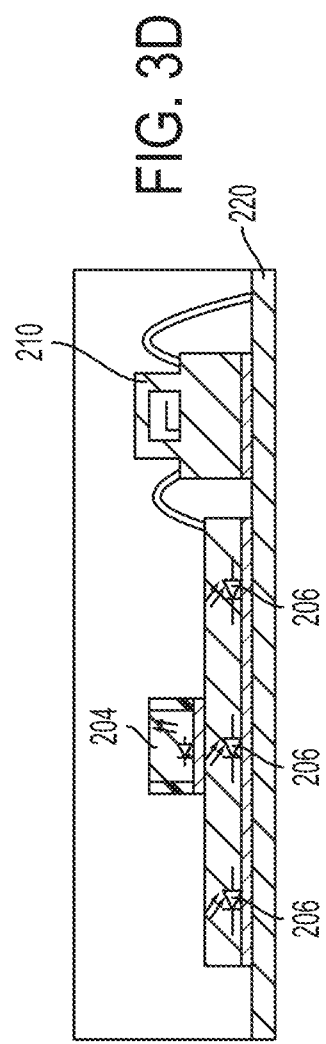

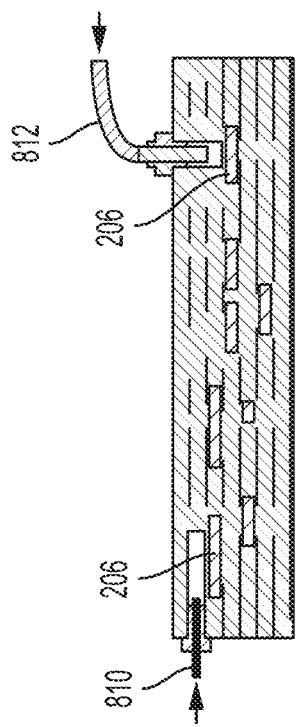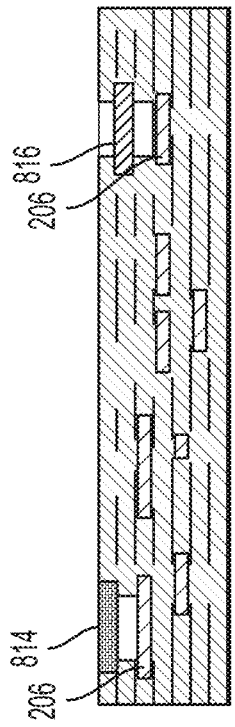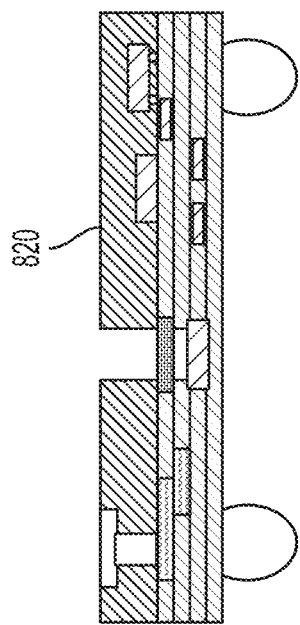

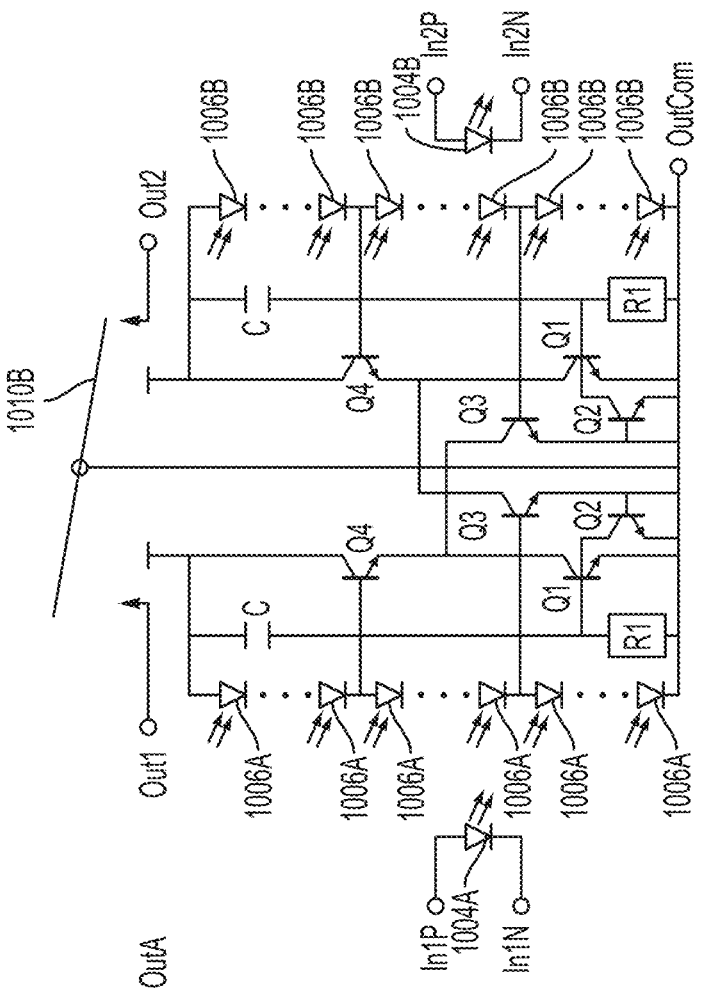
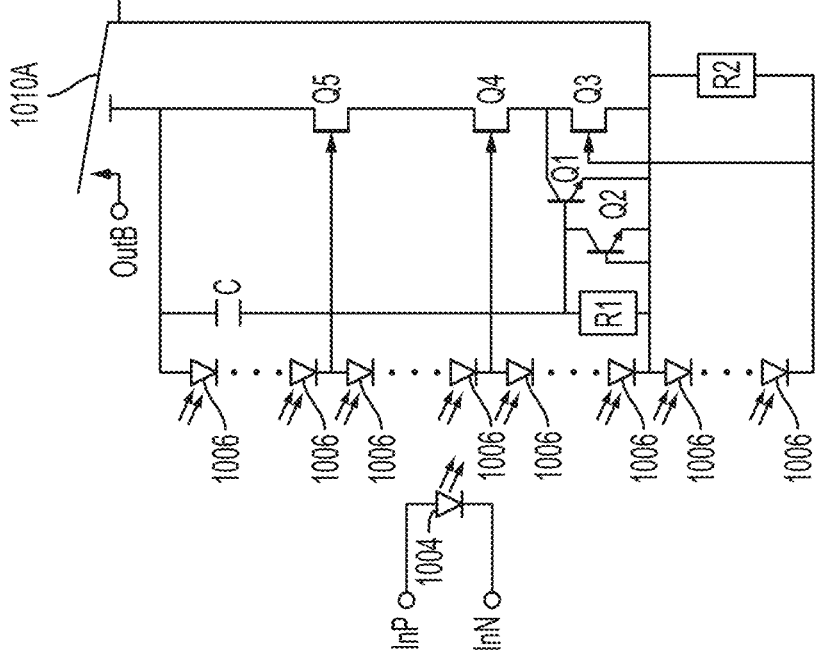
FIG. 10B
FIG. 10A

OPTICALLY ISOLATED MICROMACHINED (MEMS) SWITCHES AND RELATED METHODS COMPRISING A LIGHT TRANSMITTING ADHESIVE LAYER BETWEEN AN OPTICAL RECEIVER AND A LIGHT SOURCE

CROSS-REFERENCE TO RELATED APPLICATION

This application claims the benefit under 35 U.S.C. § 119(e) of U.S. Provisional Patent Application Ser. No. 62/643,567, entitled "OPTICALLY ISOLATED MICROMACHINED (MEMS) SWITCHES AND RELATED METHODS," filed on Mar. 15, 2018, which is hereby incorporated herein by reference in its entirety.

FIELD OF THE DISCLOSURE

The present application relates to microelectromechanical systems (MEMS) switches.

BACKGROUND

Some microelectromechanical systems (MEMS) switches include moveable beams. When in the on-state state, the moveable beam provides a passage for electric signals; when in the off-state, it blocks the passage.

SUMMARY OF THE DISCLOSURE

Some embodiments are directed to optically isolated micromachined (MEMS) switches and related methods. The optically isolated MEMS switches described herein may be used to provide isolation between electronic devices. For example, the optically isolated MEMS switches of the types described herein can enable the use of separate grounds between the receiving electronic device and the control circuitry. Isolation of high-voltage signals and high-voltage power supplies can be achieved by using an optical isolator and a MEMS switch, where the optical isolator controls the state of the MEMS switch. In some embodiments, utilizing optical isolators to provide high voltages, the need for electric high-voltage sources such as high-voltage power supplies and charge pumps may be removed, thus removing the cause of potential damage to the receiving electronic device. In one example, the optical isolator and the MEMS switch may be co-packaged on the same substrate.

Some embodiments are directed to a high-voltage optical isolation system comprising a switch having a control terminal and an optical receiver coupled to the control terminal of the switch, the optical receiver being configured to output, in response to receiving an optical signal, a voltage that is between 20V and 10000V.

Some embodiments are directed to a method for providing electric isolation between electronic devices, the method comprising driving a light source with an input signal to cause the light source to emit an optical signal; with an optical receiver, generating a voltage greater than 20V in response to receiving the optical signal; and controlling a state of a switch with the voltage.

Some embodiments are directed to a high-voltage optical isolation system, comprising a switch having a control terminal; an optical receiver coupled to the control terminal of the switch, the optical receiver being configured to output, in response to receiving an optical signal, a voltage that is between 20V and 10000V, and a release circuit coupled to the optical receiver and to the control terminal of the switch, the release circuit being configured to provide a discharge path for the control terminal of the switch.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 3A is a cross sectional view illustrating a multi-channel isolator system that may be used to provide multiple control signals to a MEMS switch, according to some non-limiting embodiments.

FIG. 3B is a cross sectional view illustrating a multi-channel isolator system in which multiple optical receivers are integrated in the same die, according to some non-limiting embodiments.

FIG. 3C is a cross sectional view illustrating a multi-channel isolator system in which multiple optical receivers are integrated in separate dies, according to some non-limiting embodiments.

FIG. 3D is a cross sectional view illustrating a multi-channel isolator system in which one optical source illuminates multiple optical receivers, according to some non-limiting embodiments.

FIG. 8C is a cross sectional view illustrating an isolator system receiving light via optical fibers, according to some non-limiting embodiments.

FIG. 8D is a cross sectional view illustrating an isolator system having filters disposed in the optical paths to the optical receivers, according to some non-limiting embodiments.

FIG. 8E is a cross sectional view illustrating an isolator system with an encapsulation layer, according to some non-limiting embodiments.

FIG. 10A is a circuit diagram illustrating a cantilevered MEMS switch and a circuit including a slew rate limiter and a release circuit, according to some non-limiting embodiments.

FIG. 10B is a circuit diagram illustrating a teeter-totter MEMS switch and a circuit including a slew rate limiter and a release circuit, according to some non-limiting embodiments.

DETAILED DESCRIPTION

Figure 1:
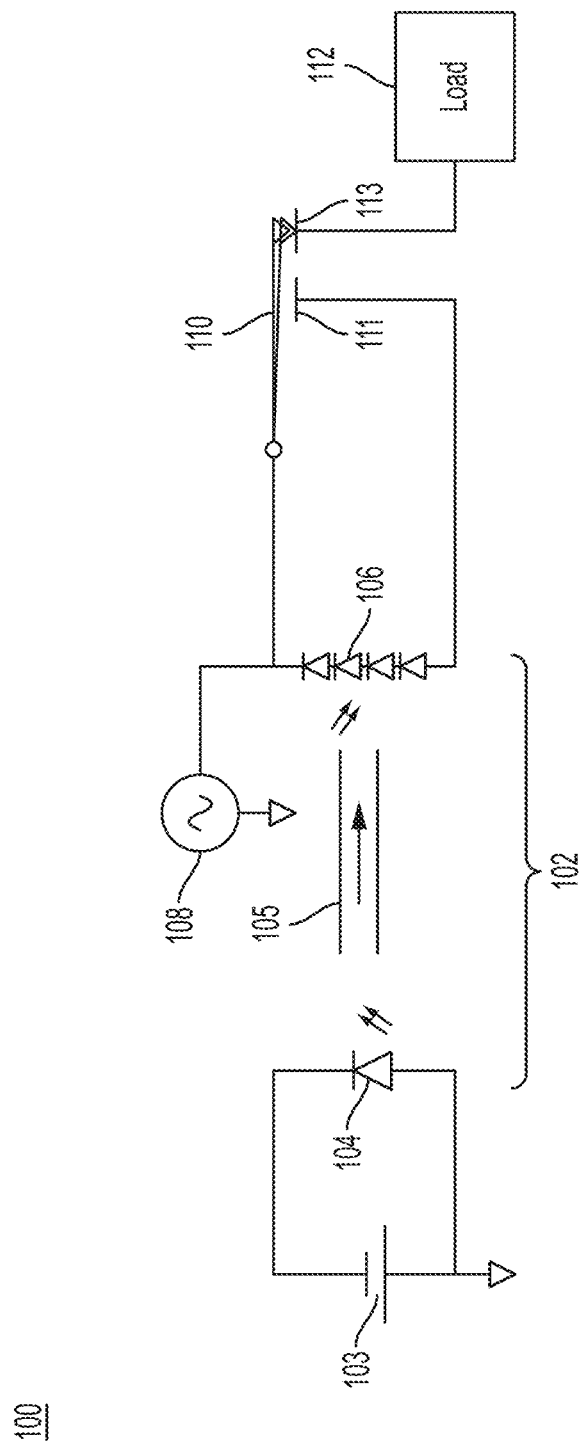
FIG. 1 is a schematic diagram illustrating an isolator system having an optically isolated MEMS switch, according to some non-limiting embodiments.

Applicant has appreciated that optically isolated MEMS switches may be used to provide isolation between electronic devices. Isolation is a technique used in electronics to transfer electrical signals from one voltage domain to another while keeping them galvanically isolated from one another. Isolation can be used, for example, to prevent high voltages from damaging low-voltage systems that are not designed to tolerate such voltages.

According to one aspect of the present application, optically isolated MEMS switches can be used to isolate the receiving electronic device from high-voltage signals as well as from high-voltage power supplies, thus improving the receiving device's robustness against voltage surges due to lightning, electrostatic discharge, radio frequency transmissions, switching pulses and perturbations in power supply, among other effects. Optically isolated MEMS switches of the types described herein can protect both the electronic equipment and the human user operating the equipment. For example, the optically isolated MEMS switches of the types described herein can enable the use of separate grounds between the receiving electronic device and the control circuitry.

Isolation of high-voltage signals and high-voltage power supplies can be achieved, at least in some embodiments, by using an optical isolator and a MEMS switch, where the optical isolator controls the state of the MEMS switch. Depending on the control signal provided by the optical isolator, the MEMS switch can be in an on-state, thereby providing a path for the passage of electrical signals, or in an off-state, thereby blocking the path.

The MEMS switches of the types described herein may include a beam, at least in some embodiments. In these embodiments, toggling the MEMS switch between the on-state and the off-state (or vice versa) may involve moving the beam between a first position and a second position. In the first position, the beam provides a conductive path for electric signals to pass through; in the second position, the conductive path is opened, thus blocking the electric signals. The beam may be moved using electrostatic forces (e.g., attraction or repulsion). To increase the durability and reliability of the MEMS switch, the beam may be sized and shaped to be stiff. As a result, the electric field needed to move such a stiff beam may be very large (e.g., in excess of 100V/m), which in turn requires a high-voltage source. High-voltage sources, however, can damage the receiving electronic device. Applicant has appreciated that, by utilizing optical isolators to provide these voltages, the need for electric high-voltage sources such as high-voltage power supplies and charge pumps may be removed, thus removing the cause of potential damage to the receiving electronic device. When used to actuate MEMS switches, the optical isolators of the types described herein may be configured to maintain substantially constant voltages between the control terminal and the beam of the MEMS switch, regardless of the electric potential being applied to the beam. Because the voltage between the control terminal and the beam is independent of the beam's electric potential, very large electric potentials can be safely transferred to a load through the beam. Furthermore, the voltages used for actuating the MEMS switches are not transferred to the load, thus contributing to the galvanic isolation, because these voltages are generated internally within the isolation system and are not reflected at the output terminal. Optical isolators of the types described herein may be configured to isolate voltages between 20V and 10000V, between 40V and 10000V, between 60V and 10000V, between 80V and 10000V, between 100V and 10000V, between 200V and 10000V or between 500V and 10000V. In this way, low-voltage domains may be isolated form high-voltage domains. It should be appreciated that removing charge pumps and high-voltage power supplies can lead, at least in some circumstances, to an overall reduction in the circuit's complexity, to a cost reduction, and/or to a noise reduction, among other benefits.

In addition, the isolator systems of the types described herein isolate, by virtue of using a MEMS switch, the receiving electric device from high-voltage signals. As such, the high voltages used for activating the MEMS switch are local to the substrate including the beam and control electrodes, and may not propagate to the receiving electric device.

Optical isolators of the types described herein may be implemented using an optical source and an optical receiver. The optical source emits photons (i.e., light). The optical receiver receives the photons emitted by the optical source and, in response, generates a high voltage. Optical receivers configured to generate, in response to receiving photons emitted by the optical source, voltages that are greater than 20V are referred to herein as high-voltage optical receivers. In some embodiments, high-voltage optical receivers may be implemented using arrays of photodetectors. Such photodetectors may be arranged, for example, in series with each other so that the voltages produced by each photodetector are added together. In this way, high voltages may be obtained using low-voltage photodetectors (e.g., silicon photodetectors). The number of photodetectors connected together in series may be selected to produce the required voltage for actuating the MEMS switch.

As one example, a MEMS switch according to a non-limiting embodiment may require a 90V actuation signal. Each photodetector of the array may output an open-circuit voltage of 0.6V when illuminated, in this non-limiting example. In this case, the required activation voltage can be achieved by connecting one hundred fifty (i.e., 90V actuation signal/0.6V per photodetector) photodetectors in series with one another. Of course, additional photodetectors may be connected in series for redundancy.

Non-limiting examples of low-voltage photodetectors include silicon PN junctions and PIN junctions. Of course other materials other than silicon may be used, including but not limited to germanium, gallium nitride, gallium arsenide, aluminum nitride, indium phosphide, or other III-V alloys.

The optical source may be implemented in different ways. In one example, a light emitting diode (LED) may be used as the optical source. In other embodiments, a laser may be used as the optical source. The light produced be the optical source may be conveyed directly (via fee space propagation of light) to the high-voltage optical receiver or indirectly (via optical conduits such as optical fibers). In other circumstances, multiple LEDs and/or lasers may be used together to produce additional photons.

Applicant has further appreciated that it may be advantageous, at least in some circumstances, to co-package the optical isolator (or at least the high-voltage optical receiver) with the MEMS switch. Accordingly, positioning these components in the same package may reduce manufacturing costs and may reduce the isolator system's form factor, thus allowing for the integration of more devices in the same space. Different packages may be used to accommodate the optical isolator (or at least the high-voltage optical receiver) and the MEMS switch. Non-limiting examples of such packages include through-hole packages, surface mount packages, die carriers, pin grid arrays, flat packages, small outline packages, die-scale packages, ball grid arrays, among others.

In at least some of the embodiments in which LEDs or lasers are used as the optical source, the optical isolators may be arranged in a stacked configuration, in which the optical source and the high-voltage optical receiver are stacked on top of one another. The stack configuration may provide several advantages. First, it may render the isolator system's form factor more compact. Second, it may reduce manufacturing costs. Third, it may enhance the percentage of photons emitted by the optical source that are actually absorbed by the high-voltage optical receiver, thus enhancing the optical efficiency.

Other techniques may be used to enhance optical efficiency in addition (or in alternative) to the stacked configuration. In some embodiments, a gel dome covered with a reflective coating may be used to encapsulate the optical isolator. Being reflective, reflection of photons may be enhanced, thus increasing the likelihood that these photons are ultimately absorbed by the optical receiver.

According to another aspect of the present application, multi-channel optical isolator systems may be provided. The multi-channel optical isolator system may include multiple optical isolators, where different optical isolators may be configured to operate at different wavelengths. The different channels may be used to control different MEMS switches, and/or to control different aspects of the operation of the same MEMS switch.

In some embodiments, to improve photonic isolation between channels (e.g., to limit crosstalk among the different high-voltage optical receivers) in multi-channel arrangements, trenches and/or barriers may be formed in areas near the optical receivers (e.g., in between adjacent optical receiver), thus blocking photons traveling in undesired directions and limiting the likelihood that these photons are absorbed by the wrong optical receiver.

Applicant has further appreciated that at least in some circumstances, the MEMS switches of the type described herein may be designed to exhibit rapid de-activation (also referred to herein as "release") upon the removal of the optical signal causing the activation. Accordingly, release circuits may be used in some embodiments to discharge the high-voltage rapidly, thus improving the response time of the switch.

Applicant has further appreciated that, at least in some circumstances, the MEMS switches of the types described herein may be susceptible to damage caused by the fact that the high-voltage optical receivers that control them exhibit abrupt responses (e.g., exhibit very fast turn-on and/or turn-off transitions). Accordingly, when a MEMS switch that includes a movable beam receives an abrupt transition (e.g., a very fast transition from a logic-0 to a logic-1), the movable beam may move with a speed larger than it can handle, and may as a result crash or bounce. To limit damage to the MEMS switches caused by these abrupt transitions, slew rate limiting circuits may be used in some embodiments. Slew rate limiting circuits of the types described herein may be configured to limit the slew rate of the switch driver, thus reducing the abruptness of the control signal.

FIG. 1 is a schematic diagram illustrating an isolator system having an optically isolated MEMS switch, in accordance with some embodiments. Isolator system 100 may include an optical isolator 102, a signal source 108, a MEMS switch 110 and a load 112. Optical isolator 102 may include an optical source 104 and a high-voltage optical receiver 106. The optically isolated MEMS switch may be configured to transfer signals between signal source 108 and load 112 while keeping them electrically isolated from each other.

It should be appreciated that, while high-voltage optical receiver 106 is implemented as an array of photodetectors in the embodiment of FIG. 1, other types of optical receivers capable of outputting voltages greater than 20V may alternatively be used. In the embodiments in which optical receiver 106 comprises a photodetector array, the number of photodetectors may be selected so that, when connected in series, they collectively produce at least the voltage necessary for actuating MEMS switch 110. For example, one hundred fifty photodetector each producing 0.6V may collectively produce 90V.

MEMS switch 110 may include a beam, a control terminal 111 and an output terminal 113. When the MEMS switch in the on-state, the beam contacts the output terminal 113, thereby providing a path for the signal produced by signal source 108 to reach the load 112. When the MEMS switch in the off-state, the movable beam does not contact the output terminal 113, and the path is thereby blocked. The position of the movable beam may be controlled electrostatically via the control terminal 111, which may be coupled to the high-voltage optical receiver 106. MEMS switch 110 may be implemented as a cantilevered beam (as shown in the embodiment of FIG. 1), as a teeter-totter beam, or in any other suitable manner.

Optical source 104, while represented in FIG. 1 as a single device, may in some circumstances comprise numerous light emitters (e.g., numerous LEDs or lasers). Optical source 104 may be controlled using signal source 103. Accordingly, when signal source 104 outputs a signal (e.g., a voltage and/or a current) that is above the optical source's threshold, optical source 104 responds by emitting photons. The photons emitted by the optical source 104 may be conveyed, via optical channel 105, to high-voltage optical receiver 106. When numerous emitters are present in optical source 104, the emitters may be connected in parallel with one another so that the voltage of signal source 103 can be set independently of the number of emitters. The optical channel 105 may include an optical apparatus (e.g., filters, lenses and diffusers) optical conduits (e.g., optical fibers and waveguides) or just free space.

The voltage produced by high-voltage optical receiver 106 in response to receiving the photons may be used to control the state of the MEMS switch, for example by electrostatically controlling, via attraction, the position of the beam. It should be appreciated that optical receiver 106 may be designed to produce high voltages (e.g., between 20V and 10000V, between 40V and 10000V, between 80V and 10000V, between 120V and 10000V, between 200V and 10000V, or between 500V and 10000V) because, due to its stiffness, the electric field needed to electrostatically move the beam may be large. It should be noted that other types of switches, other than MEMS switches, may be used, including for example 4-terminal relays. These switches may operate via repulsion.

Because optical isolator 102 is used to generate the voltages needed for moving the beam, in some embodiments, no additional high-voltage generators are needed. As such, the isolator systems of the types described herein may lack high-voltage generators such as high-voltage power supplies (e.g., supplying more than 20V) and charge pumps. Removing charge pumps and/or high-voltage power supplies may provide a significantly noise reduction. For example, certain circuits having charge pumps and/or high-voltage power supplies can exhibit noise of up to 115 dBm. Removing the charge pumps and/or high-voltage power supplies may reduce the noise to less than −135 dBm or less than −157 dBm, for example.

In addition, the isolator systems of the types described herein isolate the voltage used for actuating the MEMS switch from load 112 because such a voltage is internally generated within the isolator system 100 and does not affect the electric potential at output terminal 113.

Due to the fact that the isolation is provided optically, the voltage between the control terminal 111 and the moveable beam is substantially constant (e.g., with fluctuations of less than 5% from the constant value) over time. Because the voltage remains substantially constant, the resistance associated with the MEMS switch is also substantially constant and substantially independent of the MEMS switch's beam (e.g., substantially independent of the beam shape, type, material position and/or electrically properties). For example, some MEMS switches may exhibit a resistance vs. beam's potential slope of less than $0.1 \ \Omega/100V$. A resistance substantially independent of the electric potential applied to the MEMS switch's beam may benefit the MEMS switch in that it may reduce distortions, and as a result, enhance signal integrity. In one example, the movable beam may be set to 0V and control terminal 111 to 80V. If the potential at the movable beam is increased to 10V, the potential at the control terminal 111 may increase to 90V. As the voltage stays constant to 80V, large signals can be applied to the MEMS switch (e.g., 100V on the movable beam and 180V on the control terminal 111) without damaging the MEMS switch or causing distortions.

In some embodiments, high-voltage optical receiver 106 and MEMS switch 110 may be disposed on the same chip (e.g., a silicon die). In these embodiments, the interconnects for electrically coupling high-voltage optical receiver 106 to MEMS switch 110 may also be part of the common chip. The benefit of this implementation is that it may reduce the system's overall form factor, which may make it more suitable for certain applications. The common chip may be packaged using any suitable technique, including for example chip scale packaging (CSP) and bare die assembly. In at least some of the embodiments in which the bare die assembly is used, overmolded packages may be omitted, thus reducing packaging costs.

Figure 2B:
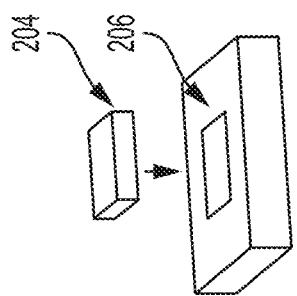
FIG. 2B is a schematic diagram illustrating an optical source and an optical receiver arranged in a stacked configuration, according to some non-limiting embodiments.
Figure 2A:
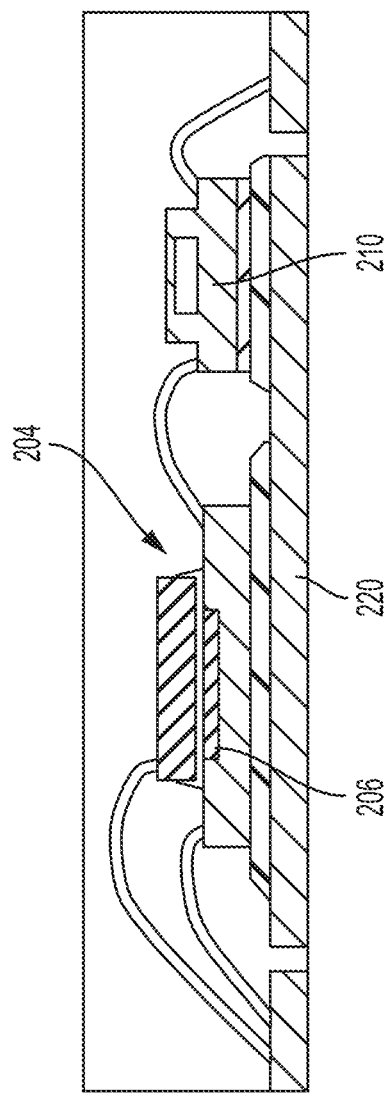
FIG. 2A is a cross sectional view illustrating an isolator system having an optical isolator co-packaged with a MEMS switch, according to some non-limiting embodiments.

In some embodiments, the optical isolator (or at least a portion of the optical isolator) and the MEMS switch may be co-packaged, which may reduce manufacturing costs and form factor. FIG. 2A illustrates a package including a high-voltage optical receiver 206, an optical source 204 and a MEMS switch 210. MEMS switch 210 and high-voltage optical receiver 206 may be disposed on a common substrate 220 (e.g., an interposer). Optical source 204 may serve as optical source 104, high-voltage optical receiver 206 may serve as high-voltage optical receiver 106, and MEMS switch 210 may serve as MEMS switch 110. MEMS switch 210 and high-voltage optical receiver 206 may be electrically coupled to each other via wire bonds, as illustrated in FIG. 2A, though other arrangements are also possible. In some embodiments, optical source 204 may be stacked on top of high-voltage optical receiver 206, as illustrated in FIG. 2B. This arrangement may further reduce manufacturing costs, and may enhance, given the proximity of the two components, the percentage of photons emitted by the optical source that are actually absorbed by the high-voltage optical receiver.

In at least some of the embodiments in which high-voltage optical receiver 106 and MEMS switch 110 are disposed on the same chip, optical source 204 may be stacked on top of (or may otherwise be co-packaged with) high-voltage optical receiver 206.

Some embodiments are directed to multi-channels isolator systems. Each channel may be supported by a different wavelength, and may be used for a different purpose. For example, when teeter-totter MEMS switches are used, one channel may be used to move the teeter-totter beam in one direction and another channel may be used to move the beam in the other direction. An example of a multi-channel isolator system according to some embodiments is illustrated in FIG. 3A. In this case, multiple high-voltage optical receivers $206_A$, $206_B$, and $206_C$ are used (not all embodiments are limited to three optical receivers).

In some embodiments, each optical receiver may be configured to receive a different optical wavelength. In other embodiments, however, the same wavelength may be used for more than one optical receiver, where each optical source may be configured to shine only (or at least mainly) the corresponding optical receiver. In at least some of the embodiments in which different wavelengths are used, optical filters may be used to filter out the undesired wavelengths. The optical filters may be placed along the optical path between the optical source and the respective optical receiver.

In some embodiments, the optical receivers may be separated from each other by trenches, which will be described further below. The different optical receivers may be disposed on the same die (as illustrated in FIG. 3B) or in separate dies (as illustrated in FIG. 3C). In the example of FIG. 3B, different optical sources 204 are separated from each other by trenches 222, where the optical sources 204 are optically coupled to respective optical receivers 206. In some embodiments, each optical source 204 is fabricated on a separate die, which is positioned on top of the optical receivers 206. In other embodiments, the optical sources 204 are fabricated on a common die, which is etched to form trenches 222 between the optical sources 204. Trenches 222 may extend through the entirety, or just a portion of, the die of optical sources 204.

In the example of FIG. 3C, the optical receivers 206 and the optical sources 204 are separated from each other by trenches 223. In some embodiments, each optical receiver 206 is fabricated on a separate die, which is positioned on substrate 220. In other embodiments, the optical receivers 206 are fabricated on a same common die, and the die is etched to form trenches 223 between the optical receivers 206. Trenches 223 may extend through the entirety, or just a portion of, the die of optical receivers 206.

In some embodiments, one optical source may be used for more than one optical receiver. The example of FIG. 3D shows one such example. In this case, the optical source 204 illuminates three optical receivers 206 (though any other suitable number of receivers may be illuminated by one common optical source in other embodiments). The optical source may emit signals at different wavelengths, each wavelength being intended for a respective optical receiver. Optical filters (not shown in FIG. 3D) may be used between the optical source and the receivers to ensure that each receiver only receives the designated wavelength.

Figure 4:
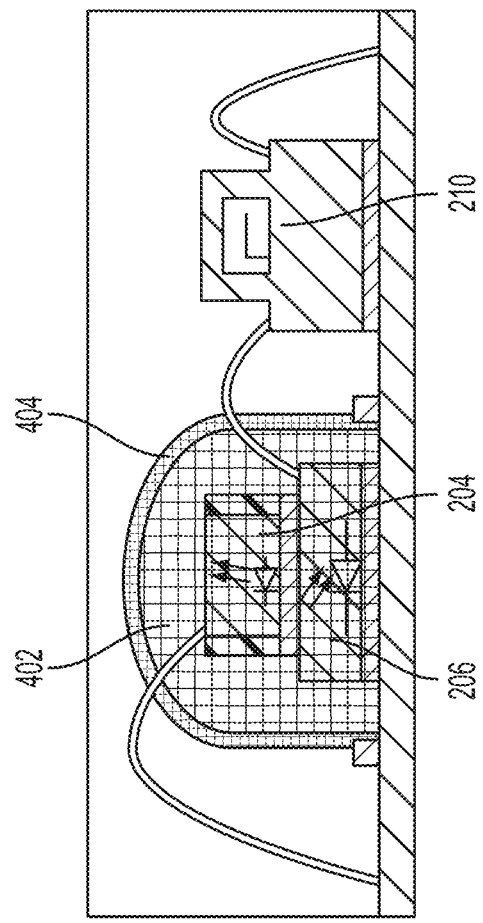
FIG. 4 is a cross sectional view illustrating an optical isolator encapsulated with a gel dome, according to some non-limiting embodiments.

In some embodiments, the optical isolator may be encapsulated in a way to enhance absorption of the emitted photons by the high-voltage optical receiver. FIG. 4, for example, illustrates an embodiment in which an optical source 204 and a high-voltage optical receiver 206 are encapsulated with a gel dome 402 (though other encapsulating materials and/or configurations may alternatively be used). Gel dome 402 may be covered, at least partially, with a reflective coating 404. The reflective coating 404 may increase the percentage of photons absorbed by the optical receiver.

Figure 5:
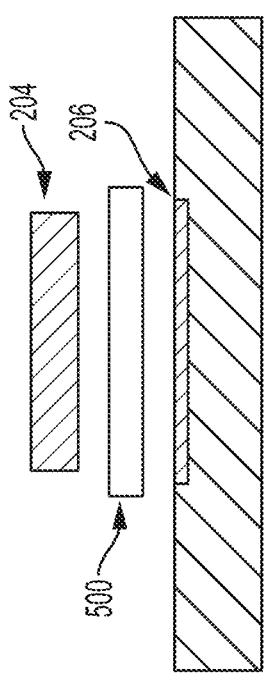
FIG. 5 is an exploded cross sectional view illustrating a light transmitting layer disposed between an optical source and an optical receiver, according to some non-limiting embodiments.

In some embodiments, an optical apparatus may be provided between optical source 204 and optical receiver 206 to process (e.g., filter, guide, direct, focus, and/or diffuse) the emitted optical field. The optical apparatus may be shaped, and may be made of a material configured to process the optical field as desired. The optical apparatus may be implemented using one or more dielectric layers that are at least partially transparent to light at the desired wavelength. For example, FIG. 5 is an exploded view illustrating a light transmitting layer 500 disposed between optical source 204 and optical receiver 206 in the stacked configuration. Light transmitting layer 500 may be made, among other materials, gel or glass, though composite materials may also be used. Light transmitting layer 500 may be configured to focus light on a specific region of the optical receiver's die, to diffuse light so that the optical receiver is shined uniformly, and/or to filter specific wavelengths, among other possible optical processing techniques. Light transmitting layer 500 may be made of, or may otherwise comprise, an adhesive material. The adhesive material may have a transmission to visible light between 75% and 100%. The adhesive material may have a refractive index, in the visible spectrum, between 1.3 and 2.5, such as between 1.4 and 1.7. The adhesive material may be made of glass, metal, plastic, among others, or any suitable combination thereof. Examples of adhesive material include epoxies, urethanes, silicones, cyanoacrylates, and UV-cured acrylics.

In the embodiments in which multiple channels are used, it may be desirable to design the optical receivers such that optical crosstalk between the channels is limited. To limit crosstalk between the different channels, non-planar optical separators may be disposed between adjacent optical receivers. These non-planar optical separators may block light propagating in directions other than the desired direction, and may be formed on the surface of the die hosting the optical receivers. Examples of non-planar optical separators include trenches and barriers.

Figure 6B:
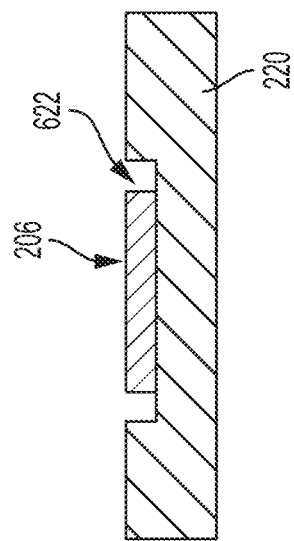
FIG. 6B is a perspective view of the optical receiver of FIG. 6A, according to some non-limiting embodiments.
Figure 6A:
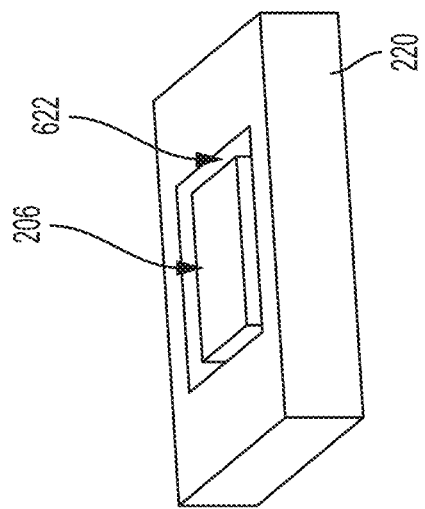
FIG. 6A is a cross sectional view illustrating an optical receiver and a trench disposed next to it, according to some non-limiting embodiments.

FIGS. 6A and 6B are a cross sectional view and a perspective view, respectively, of an optical receiver 206 having a trench 622 formed next to it. Whether the various optical receivers are disposed on the same die or on separate dies, the trench may be between adjacent optical receivers, and may be configured to scatter and/or absorb light that is not directed to the desired optical receiver. In this way, cross talk among the different channels can be mitigated. Trench 622 may be formed, at least in some embodiments, by etching a portion of the surface of the die on which the optical receiver 206 is fabricated. In other embodiments, trenches 622 are formed on substrate 220, on which the optical receiver 206 is disposed once it has been fabricated.

Figure 7B:
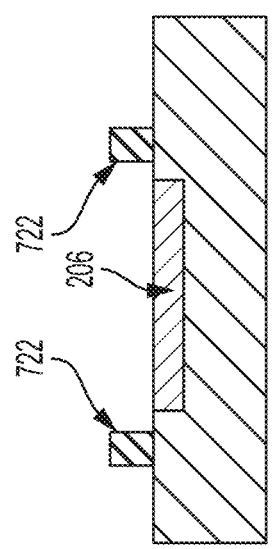
FIG. 7B is a perspective view of the optical receiver of FIG. 7A, according to some non-limiting embodiments.
Figure 7A:
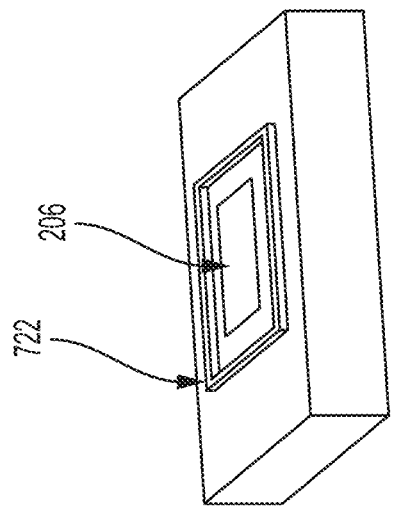
FIG. 7A is a cross sectional view illustrating an optical receiver and a barrier disposed next to it, according to some non-limiting embodiments.

FIGS. 7A and 7B are a cross sectional view and a perspective view, respectively, of an optical receiver 206 having a barrier 722 formed next to it. Whether the various optical receivers are disposed on the same die or separate dies, the barrier may be between adjacent optical receivers, and may be configured to reflect, scatter and/or absorb light that is not directed to the desired optical receiver. Barrier 722 may be raised relative to the top surface of the die.

Figure 8A:
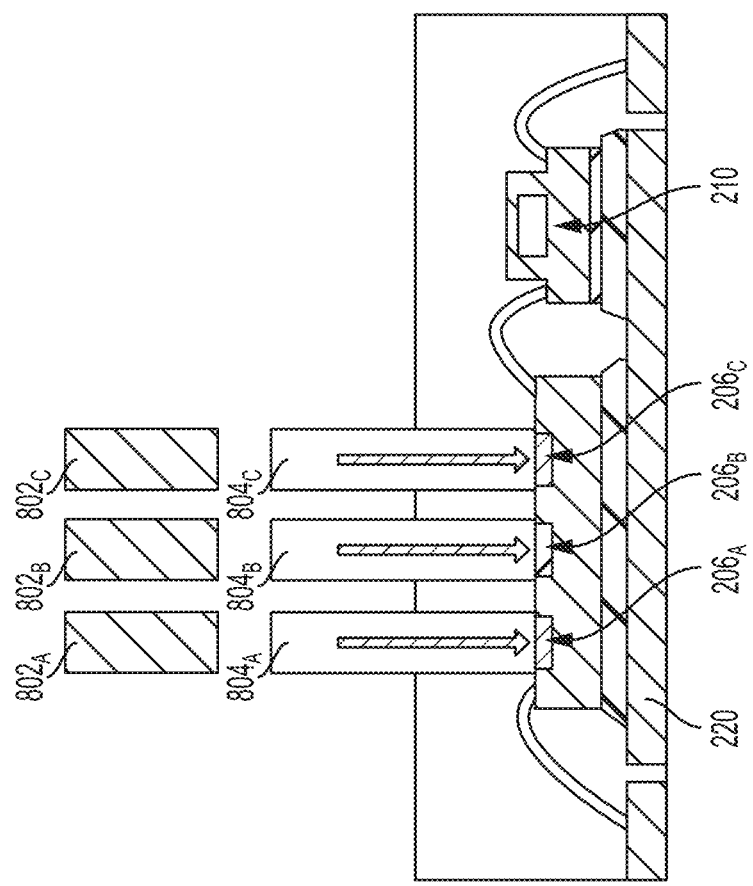
FIG. 8A is a cross sectional view illustrating an isolator system having a plurality of optical conduits formed through the package, according to some non-limiting embodiments.

In some embodiments, the optical source may be disposed on a separate package. In some of these embodiments, photons may be conveyed to the high-voltage optical receiver through one or more optical fibers, or other types of optical waveguides. The optical fiber(s) may be arranged with ends configured to emit photons towards the high-voltage optical receiver(s). FIG. 8A illustrates an arrangement in which optical fibers are used to convey photons to multiple high-voltage optical receivers, in accordance with some embodiments. In this case, the optical fibers $802_A$, $802_B$ and $802_C$ (only the optical fibers' ends are shown) have axes that are substantially perpendicular to the top surface of substrate 220 (e.g., with an angle relative to the perpendicular to the top surface that is less than 5°).

To facilitate optical coupling between the optical fibers and the corresponding optical receivers $206_A$, $206_B$ and $206_C$, optical conduits $804_A$, $804_B$ and $804_C$ may be formed in the package. These optical conduits may be formed, for example, by creating openings through the package's top surface (the surface of the package that is opposite substrate 220). Optical conduits $804_A$, $804_B$ and $804_C$ may channel photons emitted by the optical fibers to the respective optical receiver while limiting crosstalk. Optical conduits of the types described herein can be used in connection with multi-channel, as well as single-channel, optical isolators. In some embodiments, the optical conduits may be filled with a dielectric material, such as glass or gel, to process (e.g., filter, focus, diffuse) the light traveling down the conduit. In some embodiments, the frequency response of the conduits may be tuned depending on the application (for example by tuning the response of filters placed in the conduits).

Figure 8B:
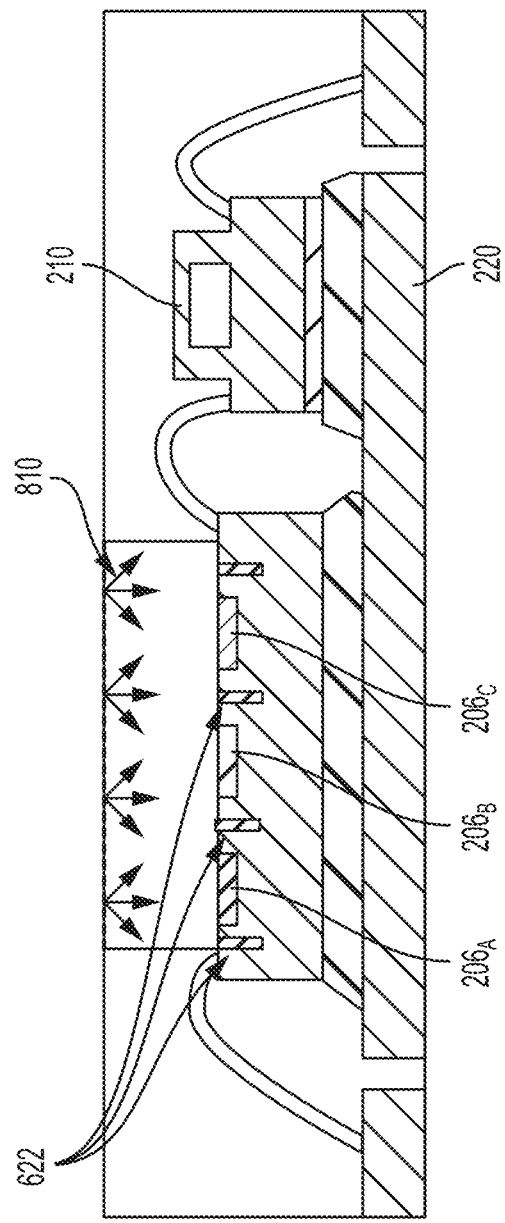
FIG. 8B is a cross sectional view illustrating an isolator system having a dielectric layer disposed over the optical receivers, according to some non-limiting embodiments.

In some embodiments, as illustrated in FIG. 8B, a layer of glass or other transparent dielectric material may be disposed over the optical receivers to diffuse light, thus distributing the light uniformly among the optical receivers.

FIG. 8C is a cross sectional view illustrating an isolator system receiving light via optical fibers, according to some non-limiting embodiments. In this example, a first optical fiber 810 is connected to one side of the substrate in which optical receivers 206 are disposed, and a second optical fiber 812 is connected to the top surface of the substrate. The light emitted from the optical fibers illuminates the respective optical receivers 206.

FIG. 8D is a cross sectional view illustrating an isolator system having filters disposed in the optical paths to the optical receivers, according to some non-limiting embodiments. As shown, optical filters 814 and 816 are disposed on the optical path to the corresponding optical receiver 206. Filter 814 is flush to the surface of the substrate, and filter 816 is disposed in a cavity formed above an optical receiver.

FIG. 8E is a cross sectional view illustrating an isolator system with an encapsulation layer, according to some non-limiting embodiments. As shown, the substrate in encapsulated with a layer 820 through which channels are formed to allow for passage of photons.

Figure 9:
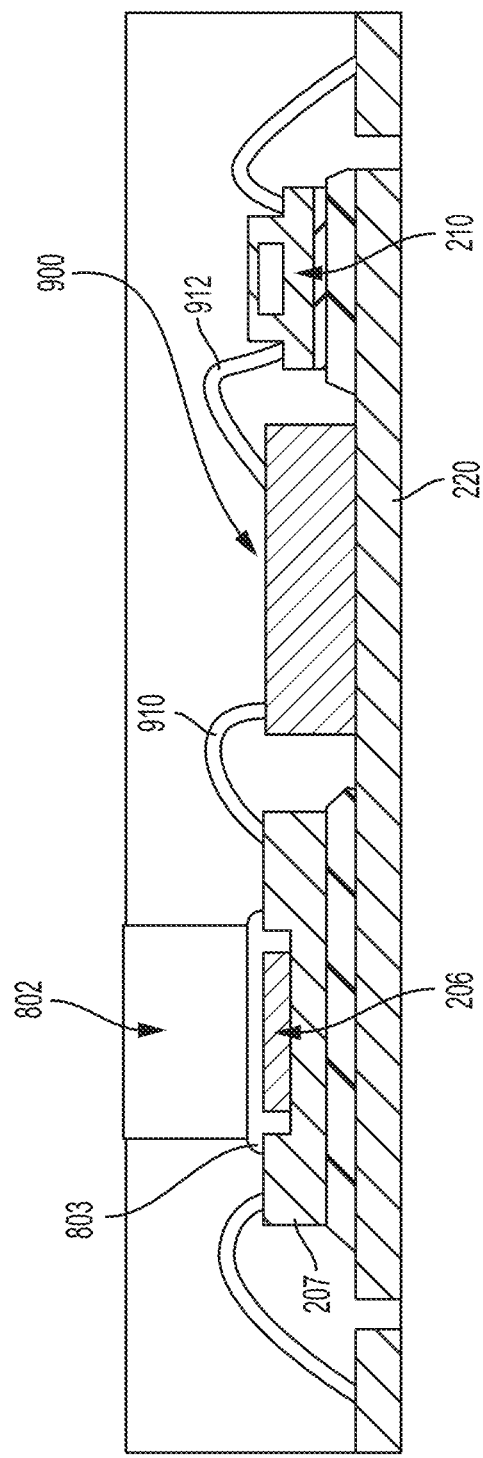
FIG. 9 is a cross sectional view illustrating a system having an optically isolated MEMS switch and an energy storing element, according to some non-limiting embodiments.

In some embodiments, it may be desirable to activate a MEMS switch depending on the occurrence of a certain event over a certain period of time. For example, it may be desirable to activate a MEMS switch if light at a certain wavelength is received for at least 60 seconds (consecutively or cumulatively). To enable time as a parameter for the activation/deactivation of MEMS switches, storage devices may be used. The storage device may, for example, accumulate electric charge as photons are absorbed by an optical receiver. Control circuitry coupled to the storage device and the MEMS switch may be used to determine when to activate the MEMS switch based on the accumulated charge. For example, the control circuitry may determine to activate a MEMS switch if the accumulated charge exceeds a predefined threshold. An example of a system including a storage device is illustrated in FIG. 9, in accordance with some embodiments. As shown, storage device 900 may be disposed on substrate 220 adjacent optical receiver 206 and MEMS switch 210. In some embodiments, storage device 900 may be implemented as one or more capacitors or batteries. In some embodiments, storage device 900 may be electrically coupled to optical receiver 206 (for example via wire bonds 910) and MEMS switch 210 (for example via wire bonds 912). Storage unit 900 may include storage cells and circuitry for controlling the operations of the storage cells. In this example, an optical fiber 802 is coupled to optical receiver 206. The optical fiber 803 may be attached to the die (207) of optical receiver 206 via bonding material 803 (e.g., epoxy or glue). In other examples, however, light may be provided through optical sources of the types described herein, which may be coupled to optical receiver 206.

The arrangement of FIG. 9 may be used at least in some embodiments as part of an energy harvesting wireless sensor node. The sensor node may be placed in a remote location with no access to power and may be configured to measure environmental quantities, such as temperature, pressure, stress, humidity, among others. The measured quantities may be wirelessly transmitted, continuously or periodically, to a base station. Energy to power the operations of the sensor node may be harvested from the environment by capturing light with optical receivers 206. The harvested energy can be stored in storage device 900.

In some circumstances, the MEMS switches of the types described herein may be susceptible to damage caused by the fact that the high-voltage optical receivers that control them may exhibit very abrupt responses. As a result, the movable beam of the MEMS switch may be controlled more quickly than it can handle, and may as a result crash or bounce. To limit damage to the MEMS switches caused by fast transitions, slew rate limiting circuits may be used in some embodiments.

The slew rate limiting circuit may act during the activation of a MEMS switch, and may control the rate at which the high-voltage applied to the control terminal of the MEMS switch builds up. Accordingly, slew rate limiting circuits of the types described herein may ensure that the force applied to the switch is not excessive, as excessive acceleration of the beam could lead to bouncing of the contacts as they close, or even deformation or damage to the contacts. In some embodiments, the slew rate limiting circuit may monitor the derivative of the voltage, and if it is determined that the derivative exceeds a predetermined threshold, it may absorb some of the current generated by the optical receiver. In this way, the resulting slew rate is lower than a desired limit.

Additionally, or alternatively, it may be desirable, at least in some embodiments, that the MEMS switches of the type described herein exhibit rapid release upon the removal of the optical signal causing the activation. To improve the speed at which the switch is released, release circuits may be used in some embodiments. In de-activating the MEMS switch when the optical source stops providing light, the high-voltage at the control terminal of the MEMS switch is removed, thus allowing the beam to revert to the open position. However, no current path is provided for the high voltage to dissipate (with the exception of the current path caused by the reverse leakage current of the optical receiver). As a result, dissipation of the high voltage may be uncontrolled, and may take excessive times in some circumstances (e.g., approximately 1 s). Release circuits of the types described herein may provide discharge paths for the high voltages, thus enabling quick opening of the switch.

FIGS. 10A-10B illustrate examples of such release circuits. The release circuit of FIG. 10A is used is connection with a cantilevered MEMS switch 1010A; the release circuit of FIG. 10B is used is connection with a teeter-totter MEMS switch 1010B.

The system of FIG. 10A includes an LED 1004 serving as the optical source 204, an array of photodetectors 1006 serving as a high-voltage optical receiver 206, a cantilevered MEMS switch 1010 serving as MEMS switch 210, a switch driver, a release circuit and a slew rate limiting circuit. The circuit of FIG. 10A includes transistors Q1, Q2, Q3, Q4 and Q5, capacitor C and resistors R1 and R2.

When the LED 1004 is activated (for example by applying a voltage between terminals InP and InN), the photodetectors 1006 may in response produce current. The lower photodiodes (those collectively positioned in parallel to resistor R2) may develop a voltage across R2. This voltage may cause transistor Q3 to stop conducting current (e.g., transistor Q3 may be a depletion-mode field-effect transistor, so that it may conduct a current when its gate-to-source voltage is below threshold). Meanwhile, the current generated by the other photodetectors may charge capacitor C, thus raising the voltage at the control terminal of the MEMS switch, which in turn may cause the beam to close. The result is that a conductive path is formed between terminals OutA and OutB. The current charging the capacitor C may also pass through resistor R1. It should be noted that the current through capacitor C may be proportional to the slew rate of the voltage across its terminals. As a result, the current through R1, and therefore the voltage applied to the base (or gate, depending on the type of transistor used for Q1) becomes proportional to the slew rate. An excessive slew rate may cause Q1 to turn on, thus sinking some of the photodetectors current through the path comprising transistors Q5, Q4 and Q1. To that end, this feedback loop may limit the slew rate to less than a predetermined limit.

When the LED 1004 stops emitting light, the photodetectors 1006 may in response stop producing current. Consequently, the bottom lower photodetectors may no longer develop a voltage across R2, and Q3 may begin to conduct. Therefore, a discharge path for the high voltage through transistors Q5, Q4 and Q3 may be formed, and the beam of the MEMS switch may open. This discharge path may accelerate the rate at which the high voltage is dissipated from the control terminal of the switch.

It should be noted that the negative slew of the high voltage built on capacitor C may cause a negative voltage to be developed across resistor R1. Such a negative voltage may damage the base-emitter junction of transistor Q1. However, transistor Q2 may be arranged to operate as a diode, thereby clamping such negative excursions to small value.

In some embodiments, transistor Q3 may be a depletion-mode field-effect transistor, though other implementations are also possible. Transistors Q4 and Q5 may be implemented using any suitable type of transistor, including for example field-effect or bipolar transistors. Transistors Q4 and Q5 may arranged in a cascode configurations, and may partition the high voltage generated by the photodiodes so that, even if these transistors are not individually configured to handle high voltages, they may be able to do so collectively.

The system of FIG. 10B includes a teeter-totter MEMS switch 1010B, LEDs 1004A and 1004B, two sets of photodetectors 1006A and 1006B, and respective switch drivers and slew rate limiting circuits. Each set of LEDs, photodetectors, switch drivers and slew rate limiting circuits may be arranged to control one side of the teeter-totter beam. As in the previous example, transistors Q1 and Q2, capacitors C and resistors R1 may serve as the slew rate limiting circuit and/or release circuit.

In some embodiments, at least one LED among the LEDs on the left-hand side (1004A) and the LEDs on the right-hand side (1004B) may be active (for example by applying a voltage between In1P and In1N or between In2P and In2N), thus causing the beam of the MEMS switch to tilt on one side or the other. The result is that the beam may contact Out1 or Out2. In some embodiments, the circuit of FIG. 10B may be symmetric, and therefore only one side will be discussed for brevity. As described in connection with FIG. 10A, the capacitor C, resistor R1, and transistor Q1 may provide slew limiting during the build-up of high voltage. Transistor Q4 may serve as a cascode device to partition the high voltage so that transistors Q1 and Q3 may not be damaged by excessively high voltage. In this arrangement, the two sets of photodetectors (1006A and 1006B) may be used so that the voltage/current developed on one side causes discharge in the opposite side. Transistor Q2 may be configured to protect transistor Q1 from reverse base voltage during discharge.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A high-voltage optical isolation system comprising:
   a switch having a control terminal;
   an optical receiver coupled to the control terminal of the switch, the optical receiver being configured to output, in response to receiving an optical signal, a voltage that is between 20V and 10000V; and
   a light transmitting adhesive layer positioned between the optical receiver and a light source.

2. The high-voltage optical isolation system of claim 1, wherein the switch and the optical receiver are disposed in a same package.

3. The high-voltage optical isolation system of claim 1, wherein the optical receiver is configured to output, in response to receiving an optical signal, a voltage that is between 60V and 10000V.

4. The high-voltage optical isolation system of claim 1, wherein the light source comprises a light emitting diode.

5. The high-voltage optical isolation system of claim 1, wherein the high-voltage optical isolation system lacks charge pumps and high-voltage supplies.

6. The high-voltage optical isolation system of claim 2, wherein the light source is disposed in the package.

7. The high-voltage optical isolation system of claim 6, wherein the light source is stacked on top of the optical receiver.

8. The high-voltage optical isolation system of claim 1, wherein the light transmitting adhesive layer is configured to focus the optical signal on the optical receiver.

9. The high-voltage optical isolation system of claim 1, further comprising a non-planar optical separator disposed adjacent to the optical receiver.

10. The high-voltage optical isolation system of claim 1, wherein the switch comprises a MEMS switch having a movable beam.

11. The high-voltage optical isolation system of claim 1, further comprising a slew rate limiting circuit coupled to the optical receiver and to the control terminal of the switch, the slew rate limiting circuit being configured to limit a slew rate of a voltage applied to the control terminal of the switch.

12. The high-voltage optical isolation system of claim 1, further comprising a release circuit coupled to the optical receiver and to the control terminal of the switch, the release circuit being configured to provide a discharge path for the control terminal of the switch.

13. A method for providing electric isolation between electronic devices, the method comprising:
   driving a light source with an input signal to cause the light source to emit an optical signal and to cause the optical signal to pass through a light transmitting adhesive layer;
   with an optical receiver, generating a voltage greater than 20V in response to receiving the optical signal, wherein the light transmitting adhesive layer is disposed between the light source and the optical receiver; and
   controlling a state of a switch with the voltage.

14. The method of claim 13, further comprising causing an electric signal to pass through the MEMS switch.

15. The method of claim 13, wherein the optical receiver comprises a plurality of photodetectors and wherein controlling the state of the switch comprises timing activation of the plurality of photodetectors to obtain a desired slope in a control signal.

16. A high-voltage optical isolation system, comprising:
   a switch having a control terminal;
   an optical receiver coupled to the control terminal of the switch, the optical receiver being configured to output, in response to receiving an optical signal, a voltage that is between 20V and 10000V;
   a light transmitting adhesive layer positioned between the optical receiver and a light source; and
   a release circuit coupled to the optical receiver and to the control terminal of the switch, the release circuit being configured to provide a discharge path for the control terminal of the switch.

17. The high-voltage optical isolation system of claim 16, wherein the optical receiver comprises a plurality of photodetectors.

18. The high-voltage optical isolation system of claim 16, wherein the release circuit comprises a plurality of transistors arranged in a cascode configuration.

19. The high-voltage optical isolation system of claim 16, wherein the switch and the optical receiver are disposed in a same package.

20. The high-voltage optical isolation system of claim 16, further comprising a slew rate limiting circuit coupled to the optical receiver and to the control terminal of the switch, the slew rate limiting circuit being configured to limit a slew rate of a voltage applied to the control terminal of the switch.

* * * * *